United States Patent [19]
Yamashita et al.

[11] Patent Number: 5,305,275
[45] Date of Patent: Apr. 19, 1994

[54] SEMICONDUCTOR MEMORY DEVICE CAPABLE OF CORRECT READING OF DATA UNDER VARIABLE SUPPLY VOLTAGE

[75] Inventors: Masayuki Yamashita; Tatsuki Furusho; Yasuhiro Kouro, all of Hyogo, Japan

[73] Assignee: Mitsubishi Denki Kabushiki Kaisha, Tokyo, Japan

[21] Appl. No.: 913,315

[22] Filed: Jul. 15, 1992

[30] Foreign Application Priority Data

Feb. 5, 1992 [JP] Japan ................................. 4-020140

[51] Int. Cl.$^5$ .............................................. G11C 7/00
[52] U.S. Cl. ...................................... 365/226; 365/229
[58] Field of Search ................ 365/226, 229; 307/350, 307/360, 363, 272.3, 296.8, 296.1

[56] References Cited

U.S. PATENT DOCUMENTS

| | | | |
|---|---|---|---|
| 4,524,291 | 6/1985 | Lehning | 307/360 |
| 4,810,910 | 3/1989 | Schoellikopf | 365/203 |
| 5,013,935 | 5/1991 | Mahabadi | 307/350 |
| 5,031,145 | 7/1991 | Lever | 365/189.05 |
| 5,083,045 | 1/1992 | Yim | 307/350 |
| 5,097,146 | 3/1992 | Kowalski | 307/363 |

OTHER PUBLICATIONS

"A 1.7 Volts Operating CMOS 64KBit E$^2$PROM", Yukio Wada et al., 1989 Symposium on VLSI Circuits, pp. 41-42.

Primary Examiner—Eugene R. LaRoche
Assistant Examiner—A. Zarabian
Attorney, Agent, or Firm—Lowe, Price, LeBlanc & Becker

[57] ABSTRACT

An improved flash EEPROM with a sense amplifier having a sensing characteristics suitable for sensing a data signal under an externally applied supply voltage Vcc in a lower range, and a sense amplifier having a sensing characteristics suitable for sensing a data signal under the supply voltage Vcc in a higher range. A Vcc level detecting device detects in which range the supply voltage Vcc is in, so as to selectively enable one of sense amplifiers. Since the data signal is amplified using the sense amplifier having the optimum sensing characteristics in accordance with the level of the supply voltage, the stored data can be accurately read.

23 Claims, 8 Drawing Sheets

FROM MEMORY CELL ARRAY 1

SEMICONDUCTOR MEMORY DEVICE CAPABLE OF CORRECT READING OF DATA UNDER VARIABLE SUPPLY VOLTAGE

BACKGROUND OF THE INVENTION

1. Field of the Invention

The present invention relates, generally, to semiconductor memory devices, and particularly to semiconductor memory devices capable of correct reading of stored data under a variable supply voltage. The invention is particularly applicable to nonvolatile semiconductor memories such as flash EEPROMs.

2. Description of the Background Art

In recent years, semiconductor memory devices have been used in various electronic equipments. Particularly, programmable EPROMs capable of erasing data, EEPROMs and flash EEPROMs have been known as nonvolatile semiconductor memories having floating gates. The flash EEPROM is one of a flash erasing type memory (i.e., is operable to electrically and simultaneously erase all bits of stored data), and can program the data byte by byte. Further, one memory transistor forms one memory cell, which enables high integration on a semiconductor substrate.

Many small electronic equipments using semiconductor memories are powered not only by external power supplies but also by internal power supplies, i.e., batteries. The power can be supplied selectively from the external power supplies and internal power supplies.

Generally, externally supplied power has a stable voltage level, but an output voltage of a battery decreases as a discharging time elapses In other words, when the power is supplied by the battery, the supply voltage is variable Although the invention is generally applicable to various semiconductor memories, an example, in which the invention is applied to a flash EEPROM, will be described hereinafter.

FIG. 9 is a block diagram showing a background of the invention, and particularly showing a flash EEPROM. Referring to FIG. 9, an EEPROM 200 includes a memory cell array 1 provided with a large number of memory cells MC arranged in rows and columns, a row decoder 2 for selectively activating word lines X1–Xm, a column decoder 3a for selecting a memory block (or region) to be accessed, a column decoder 3b for selecting a bit line to be accessed in the memory block, a sense amplifier 5 for amplifying a data signal, and an output buffer 6 for supplying output data $D_0$. Although the circuit block for reading the data is shown in FIG. 9, it should be noted that flash EEPROM 200 comprises a circuit block for writing the data, not shown.

In the reading operation, row decoder 2 decodes an externally applied row address signal (not shown) to activate selectively one of word lines X1–Xm. Memory cell MC connected to the activated word line grounds bit lines BL1–BLn in accordance with the stored data signal Each memory cell MC is turned on or off in response to the stored data signal. Therefore, potentials of bit lines BL1–BLn are brought to a ground potential or a floating state in accordance with the data stored in the memory cell accessed by row decoder 2.

Column decoder 3a supplies block selecting signals YA1–YAi in response to an externally applied column address signal (not shown). NMOS transistors 61–6i for selecting the blocks are selectively turned on in response to block selecting signals YA1–YAi, respectively. Column decoder 3b decodes the externally applied column address signal (not shown) to supply column selecting signals YB1–YBn. NMOS transistors 91–9n for selecting the column are selectively turned on in response to column selecting signals YB1–YBn, respectively.

Therefore, the potential of one bit line selected by column decoder 3b, i.e., the read data signal is transmitted from the memory block selected by column decoder 3a to sense amplifier 5. Sense amplifier 5 amplifies the transmitted data signal, and the amplified data signal is supplied as output data $D_0$ from output buffer 6.

FIG. 10 is a circuit diagram of sense amplifier 5 shown in FIG. 9. Referring to FIG. 10, sense amplifier 5 includes PMOS transistors 21, 22 and 23 as well as NMOS transistors 24, 25 and 26. Transistors 21, 22 and 23 have their gates grounded. Transistor 24 has a gate connected to a signal line 27. Transistors 22 and 25 are connected in series between power supply potential Vcc and signal line 27. Transistors 23 and 26 are connected in series between supply potential Vcc and signal line 27. Signal line 27 corresponds to signal line 27 shown in FIG. 9. Amplified signal $SA_5$ is supplied through a common connection node of transistors 23 and 26.

Then, an operation of sense amplifier 5 for reading the data will be described below. First, a case will be described in which the data stored in the memory cell MC designated by row decoder 2 and column decoders 3a and 3b is "1". It is also assumed that the memory transistor forming the memory cell MC is turned on in this case. Therefore, the potential at input node N3 in sense amplifier 5 lowers, and thus transistor 24 is turned off. Thereby, the potential at node N2 rises, so that transistors 25 and 26 are turned on. Owing to the turn-on of transistors 25 and 26, the potential of node N3 is maintained at a level which is not very low. Consequently, amplified signal $SA_5$ at the low level is supplied through output node N1.

In the foregoing operation, it is noted that transistor 25 operates to prevent excessive lowering of the potential of input node N3. If the potential of input node N3 is excessively lowered, the rising of the potential of the bit line would be delayed when the data signal at the inverted level (i.e., the high level in the above case) were read in the next read cycle. Therefore, it is noted that transistor 25 contributes to reduce the time required for reading the data.

When the memory cell MC designated by row decoder 2 and column decoders 3a and 3b stores "0", the designated memory cell MC is turned off. Therefore, the potential of input node N3 in sense amplifier 5 has the high level, and thus transistor 24 is turned on. Thereby, the potential of node N2 has the low level, and thus transistors 25 and 26 are turned off. Consequently, excessive increase of the potential of input node N3 is prevented. In this case, amplified signal $SA_5$ at the high level is supplied through output node N1.

FIG. 11 is a diagram showing transition of an output voltage of sense amplifier 5 under variable supply voltage Vcc. Referring to FIG. 11, the abscissa represents the change of the supply voltage Vcc and the ordinate represents the change of the output voltage of sense amplifier 5. Referring to FIG. 11, when the data read from the memory cell is "0", sense amplifier 5 supplies the output voltage indicated by line $SA_{50}$. When the memory cell stores the data of "1", sense amplifier 5 supplies the output voltage indicated by line $SA_{51}$. As shown in FIG. 11, output voltage $SA_{50}$ for the data of "0" and output voltage $SA_{51}$ for the data of "1" changes as the supply voltage Vcc changes.

Further, line Vth in FIG. 11 indicates the change of threshold voltage of a circuit at the succeeding stage (e.g., output buffer 6 shown in FIG. 9) connected to the output of the sense amplifier 5. Line Vth indicates the threshold voltage of a circuit such as an inverter, which receives the output voltage of sense amplifier 5.

Flash EEPROM 200 is designed to operate properly under the fixed supply voltage Vcc. Specifically, sense amplifier 5 is designed to correctly sense the data signal supplied from the memory cell under the fixed supply voltage, e.g., Vcc of 5 V. In other words, conventional sense amplifier 5 supplies output data signals $SA_{50}$ and $SA_{51}$ suitable to threshold voltage Vth of the circuit connected in the succeeding stage when the fixed supply voltage (Vcc=5 V) is supplied.

Accordingly, when the electronic equipment receives the supply voltage from the battery, i.e., internal power supply, the output voltage of the battery gradually reduces as the discharging time of the battery elapses. This means that the supply voltage Vcc supplied to the semiconductor memory gradually reduces. As can be understood from FIG. 11, output voltages $SA_{50}$ and $SA_{51}$ of sense amplifier 5 and threshold constant voltage Vth of the circuit at the succeeding stage are designed to be optimum under the supply voltage Vcc of 5 V supplied thereto. In other words, they are designed to perform the correct data reading operation under the supply voltage of 5 V. Due to the lowering of supply voltage Vcc, a relation between output voltages $SA_{50}$ and $SA_{51}$ of sense amplifier 5 and threshold constant voltage Vth of the circuit in the succeeding stage changes in a direction indicated by an arrow AR in FIG. 11, so that the optimum relationship for the data reading is destroyed. Particularly, in a case that supply voltage Vcc lowers approximately below 3 V, all output voltages $SA_{50}$ and $SA_{51}$ exceed threshold voltage Vth. This means that all data is read as "0" under such supply voltage Vcc. In other words, lowering of supply voltage Vcc causes error in the data reading operation.

In order to avoid the above problems, there may be additionally provided other semiconductor memories which are provided with sense amplifiers having the optimum sensing characteristics under the supply voltage Vcc of 3 V. However, this increases the number of semiconductor devices used in the small electronic equipment, which is not preferred in view of the space and cost.

SUMMARY OF THE INVENTION

An object of the present invention is to enable correct reading of stored data in a semiconductor memory device which is operable under a variable supply voltage.

Another object of the present invention is to enable correct reading of stored data in a nonvolatile semiconductor memory device which is operable under a variable supply voltage.

Still another object of the present invention is to enable correct reading of stored data in a semiconductor memory device which is applicable to an electronic equipment using a battery as an internal power supply.

Briefly stated, a semiconductor memory device in accordance with the present invention includes a memory cell array including a plurality of memory cells disposed in rows and columns; and first and second sense amplifiers which are connected to receive a data signal provided from the memory cell array. The first sense amplifier has sensing characteristics suitable for sensing the data signal under the supply voltage in a predetermined lower range. The second sense amplifier has sensing characteristics suitable for sensing the data signal under the supply voltage in a predetermined higher range. The semiconductor memory device in accordance with the present invention further includes a supply voltage level detecting circuit for detecting in which one of the predetermined lower range and the predetermined higher range a level of the externally applied supply voltage exist; and a selectively enabling circuit for selectively enabling one of the first and second sense amplifiers in response to the output from supply voltage level detecting circuit.

In an operation, the supply voltage level detecting circuit detects the range in which the level of the externally applied supply voltage exists, and the selectively enabling circuit selectively enables one of the first and second sense amplifiers in response to the result of detection. Therefore, the data signal supplied from the memory cell array is amplified by the sense amplifier having the sensing characteristics suitable for the level of the externally applied supply voltage, and thus the correct reading of the data signal can be achieved.

According to another aspect of the present invention, a semiconductor memory device includes a memory cell array including a plurality of memory cells disposed in rows and columns; a differential sense amplifier having a first input node connected to receive a data signal supplied from the memory cell array; first and second reference voltage sources which generate a low reference voltage and a high reference voltage, respectively; a supply voltage level detecting circuit for detecting in which one of a predetermined lower range and a predetermined higher range a level of the externally applied supply voltage exists; and a selectively supplying circuit for selectively supplying one of the first and second reference voltages to a second input node of the differential sense amplifier in response to the supply voltage level detecting circuit.

In operation, the supply voltage level detecting circuit detects the range of the level of the externally applied supply voltage, and the selectively applying circuit applies one of the first and second reference voltages to the second input node of the differential sense amplifier in response to the result of detection. Therefore, even if the externally applied supply voltage changes, the differential sense amplifier amplifies the data signal supplied from the memory cell array based on the reference voltage, which is applied in accordance with the applied supply voltage, and thus correct reading of the data signal can be achieved.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
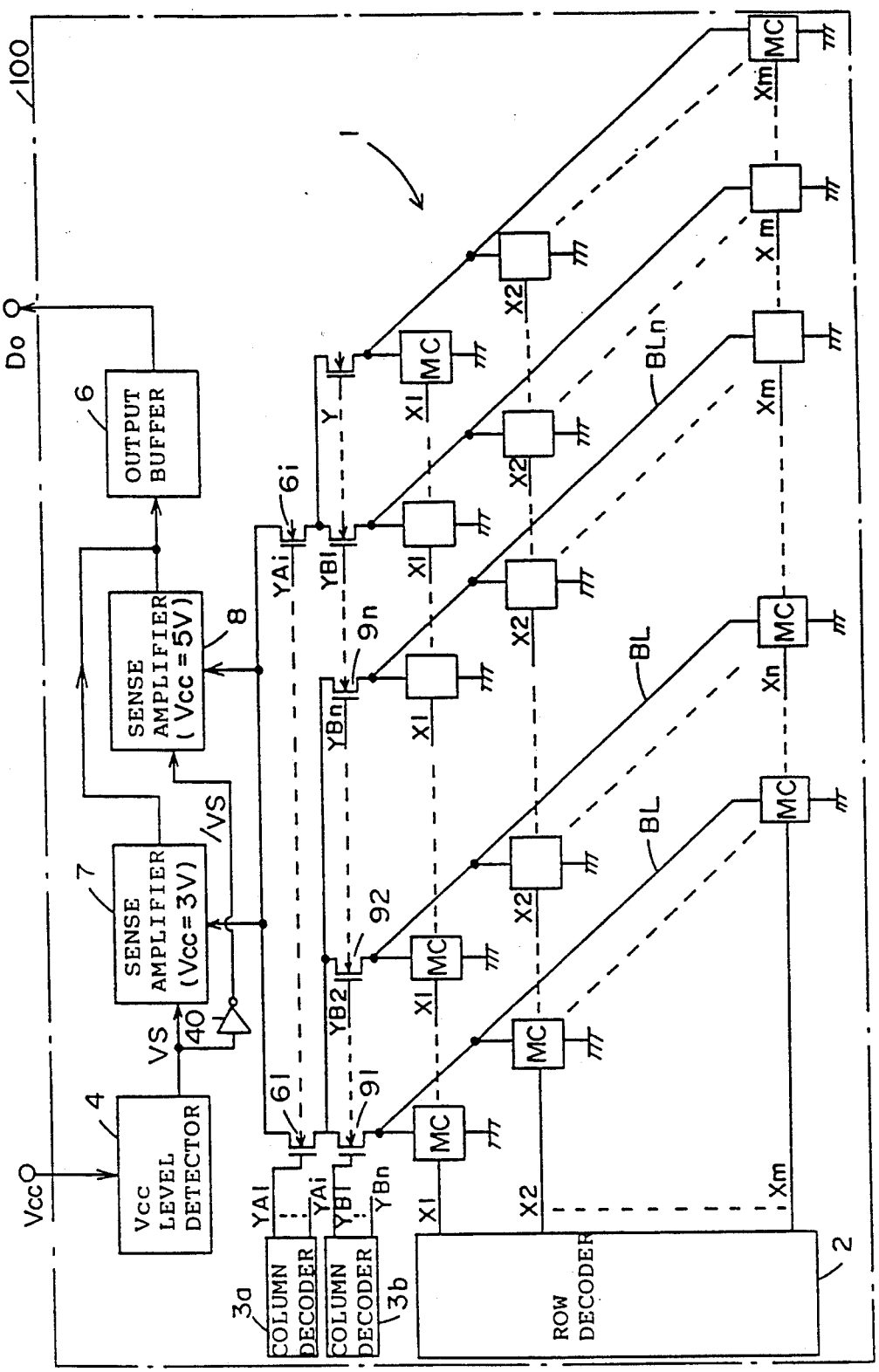
FIG. 1 is a block diagram of a flash EEPROM showing an embodiment of the invention.
Figure 9:
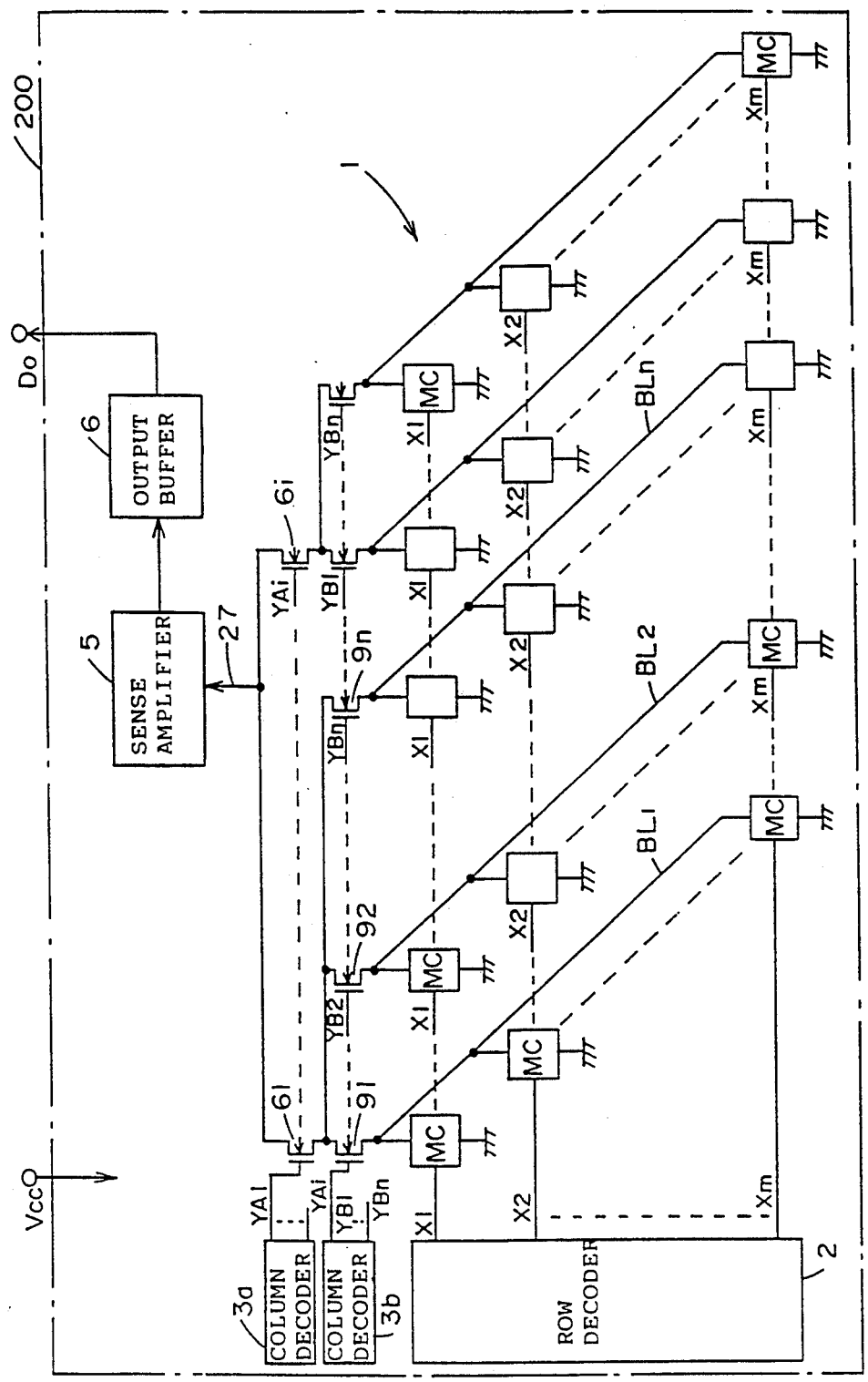
FIG. 9 is a block diagram of a flash EEPROM showing background of the invention.

Referring to FIG. 1, a flash EEPROM 100 includes a supply voltage level detector (hereinafter referred to as "Vcc level detector") 4 which detects a range of a level of an externally applied supply voltage, a sense amplifier 7 which is optimized in a lower range of the supply voltage, and a sense amplifier 8 which is optimized in a higher range of the supply voltage. Other circuit constructions are similar to those of flash EEPROM 200 shown in FIG. 9, and thus will not be described below. Line 100 also indicates the semiconductor substrate.

In operation, Vcc level detector 4 detects and determines a range (i.e., predetermined lower range or predetermined higher range) in which the level of externally applied supply voltage Vcc exists. Specifically, in this embodiment, Vcc level detector 4 supplies a signal VS at the low level when supply voltage Vcc is 4 V or less. Sense amplifier 7 is enabled in response to signal VS, and sense amplifier 8 is disabled in response to an inverted signal /VS. Therefore, under supply voltage Vcc of 4 V or less, sense amplifier 7 amplifies the data signal read from memory cell array 1 to apply the amplified signal to output buffer 6.

When supply voltage Vcc higher than 4 V is supplied, Vcc level detector 4 supplies signal VS at the high level. Sense amplifier 7 is disabled in response to signal VS, and sense amplifier 8 is enabled in response to inverted signal /VS. Therefore, under supply voltage Vcc higher than 4 V, sense amplifier 8 amplifies the data signal to apply the amplified signal to output buffer 6.

Figure 2:
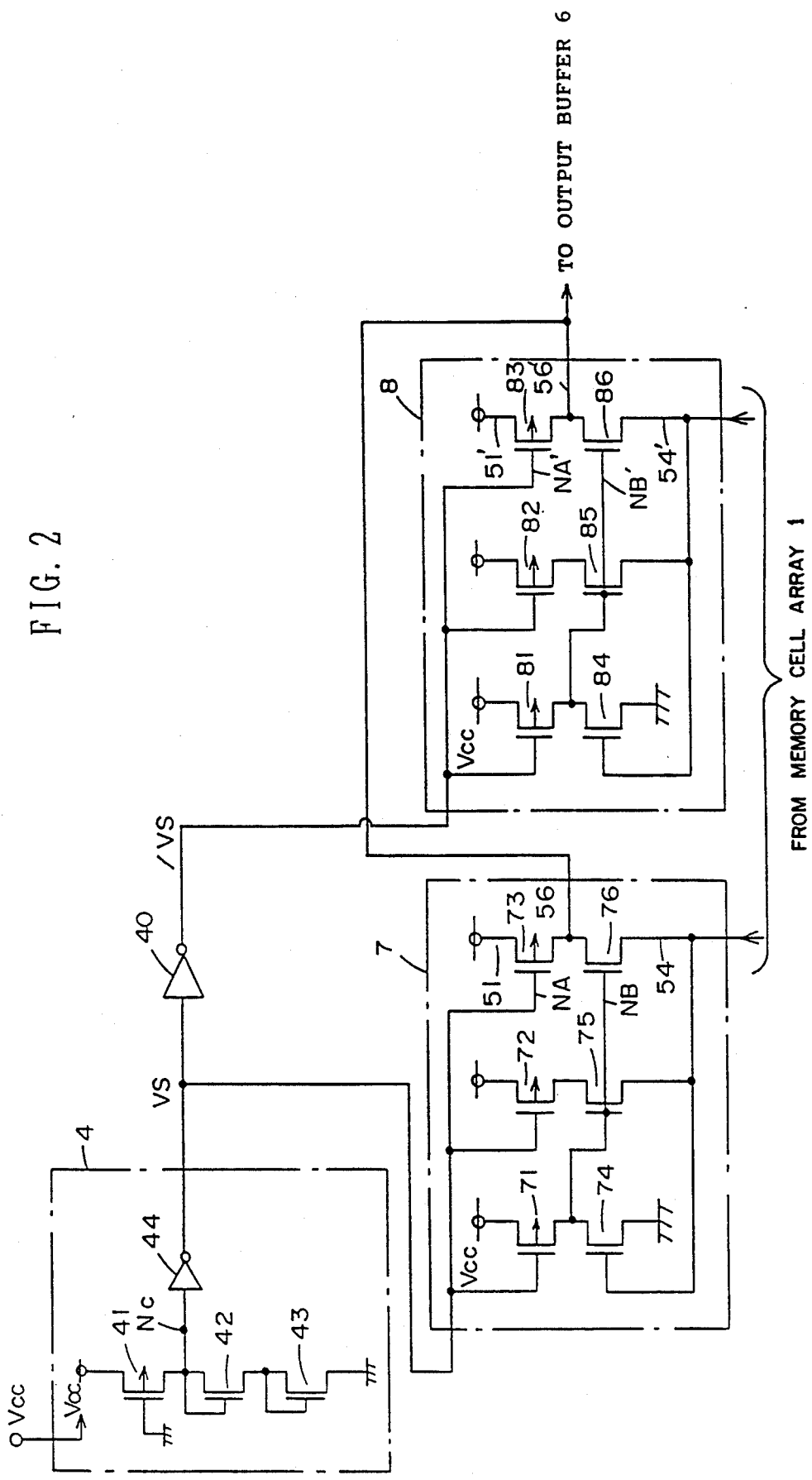
FIG. 2 is a circuit diagram of a Vcc level detector 4 and sense amplifiers 7 and 8 shown in FIG. 1.

FIG. 2 is a circuit diagram of Vcc level detector 4 and sense amplifiers 7 and 8 shown in FIG. 1. Referring to FIG. 2, Vcc level detector 4 includes a PMOS transistor 41 and NMOS transistors 42 and 43, which are connected in series between externally applied supply voltage Vcc and the ground, as well as an inverter 44. Transistor 41 has its gate grounded. Each of transistors 42 and 43 has a gate and a drain connected together.

Figure 10:
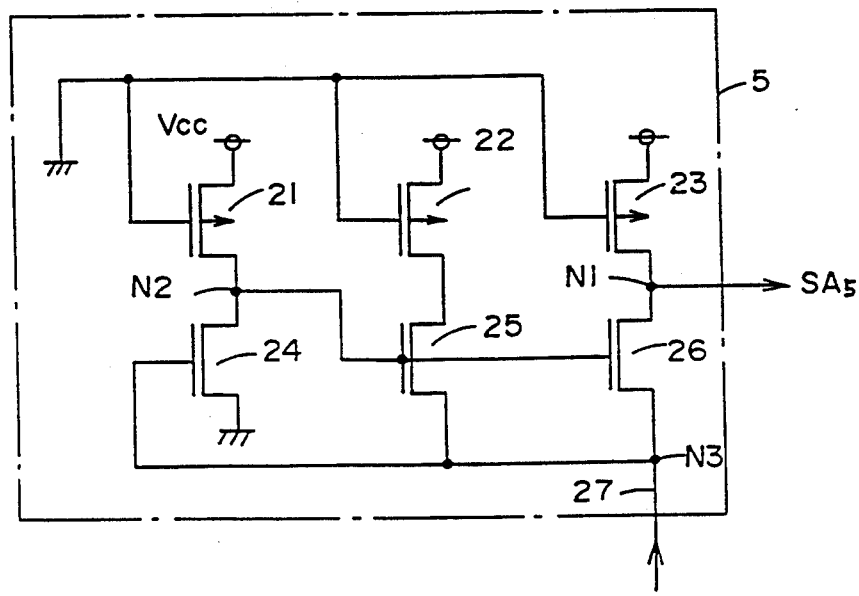
FIG. 10 is a circuit diagram of a sense amplifier 5 shown in FIG. 9.
Figure 11:
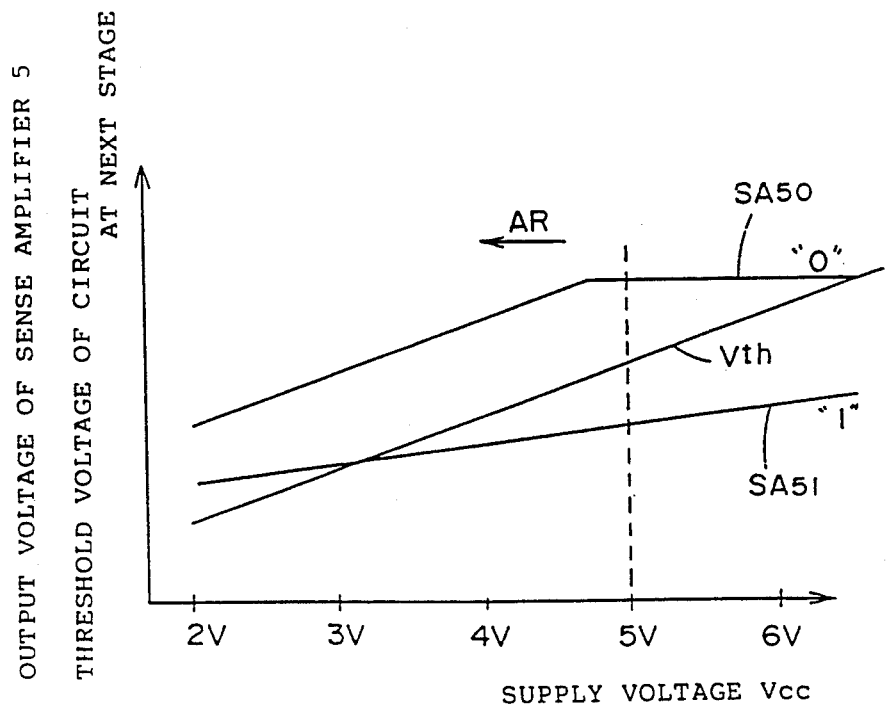
FIG. 11 is a diagram showing transition of an output voltage of sense amplifier 5 shown in FIG. 5 under variable supply voltage Vcc.

Since sense amplifiers 7 and 8 have the same circuit constructions as the sense amplifier 5 shown in FIG. 10, they carry out the amplifying operations in a similar manner. However, sense amplifier 7 has the sensing characteristics suitable to the amplification under the supply voltage Vcc of 3 V. Meanwhile, sense amplifier 8 has the sensing characteristics suitable to the amplification under the supply voltage Vcc of 5 V. In other words, sense amplifiers 7 and 8 have the different sensing characteristics so that optimum sensing of the data signal may be carried out under the different values of supply voltage Vcc.

Sense amplifier 7 includes PMOS transistors 71, 72 and 73 as well as NMOS transistors 74, 75 and 76. Transistors 71, 72 and 73 have gates which receive signal VS supplied from Vcc level detector 4. Sense amplifier 8 includes PMOS transistors 81, 82 and 83 as well as NMOS transistors 84, 85 and 86. Transistors 81, 82 and 83 have gates which receive inverted signal /VS.

Figure 3:
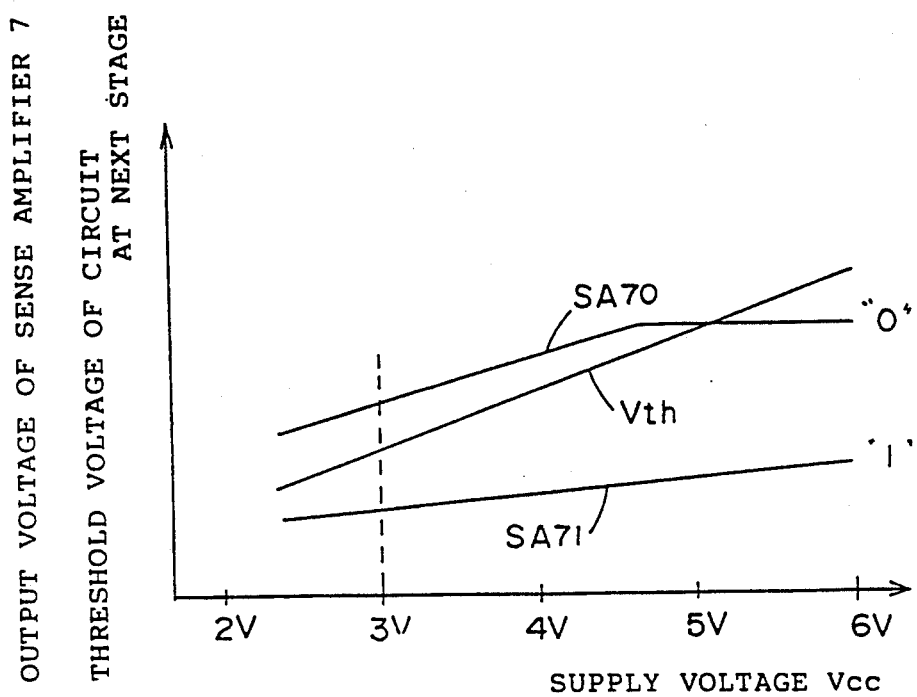
FIG. 3 is a diagram showing transition of an output voltage of sense amplifier 7 shown in FIG. 2 under a variable supply voltage.

FIG. 3 is a diagram showing transition of the output voltage of sense amplifier 7 shown in FIG. 2 under variable supply voltage Vcc. Referring to FIG. 3, the abscissa represents the variation of supply voltage Vcc. Line $SA_{70}$ indicates the variation of the output voltage of sense amplifier 7 when data "0" is read. Line $SA_{71}$ indicates the variation of the output voltage of sense amplifier 7 when data "1" is read. Line Vth indicates the variation of the threshold voltage of the circuit in the next stage which is connected to the output of the sense amplifier 7. As can be seen from FIG. 3, sense amplifier 7 has the optimum sensing characteristics for the data signal under the supply voltage of 3 V. That is; when the supply voltage of 3 V is supplied, threshold voltage Vth of the circuit in the next stage has the middle value between output voltages $SA_{70}$ and $SA_{71}$ of sense amplifier 7.

Figure 4:
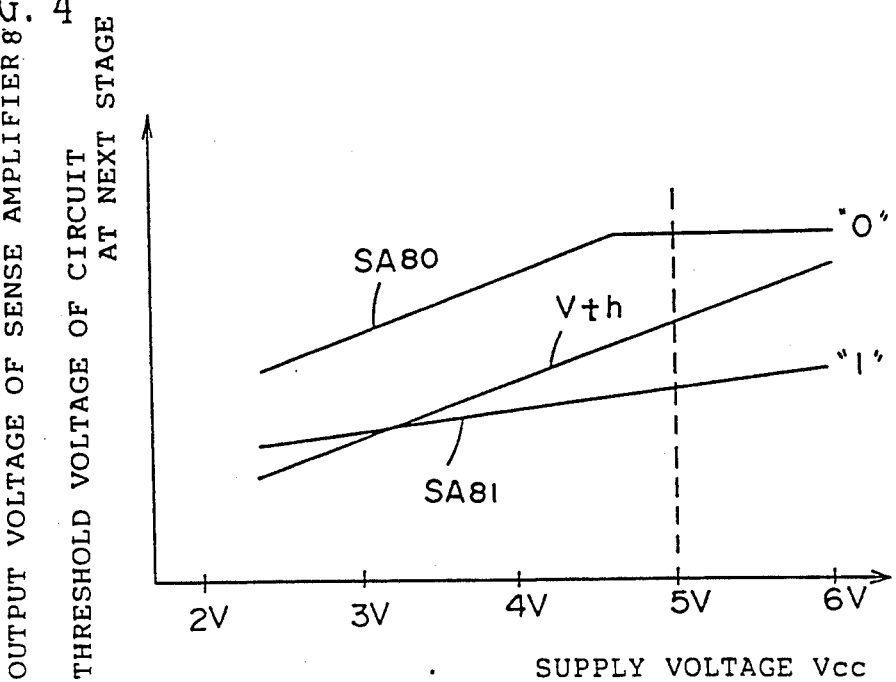
FIG. 4 is a diagram showing transition of an output voltage of sense amplifier 8 shown in FIG. 2 under a variable supply voltage.

FIG. 4 is a diagram showing transition of the output voltage of sense amplifier 8 shown in FIG. 2 under variable supply voltage Vcc. Referring to FIG. 4, line $SA_{70}$ indicates the variation of the output voltage of sense amplifier 8 when data "0" is output. Line $SA_{71}$ indicates the variation of the output voltage of sense amplifier 8 when data "1" is read. As can be seen from FIG. 4, sense amplifier 8 has the optimum characteristics for sensing the data signal under the supply voltage Vcc of 5 V.

Figure 5:
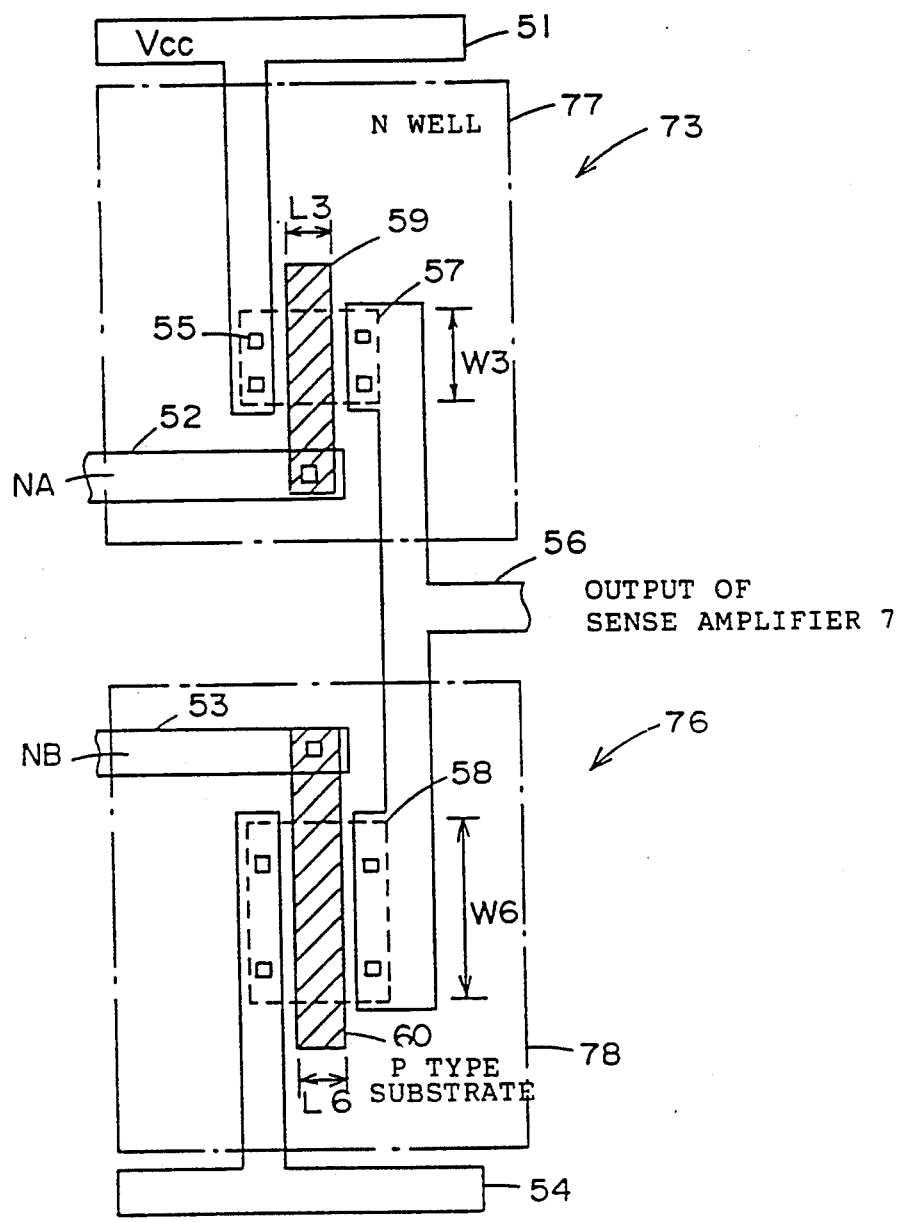
FIG. 5 shows a layout of transistors 73 and 76 shown in FIG. 2 on a semiconductor substrate.
Figure 6:
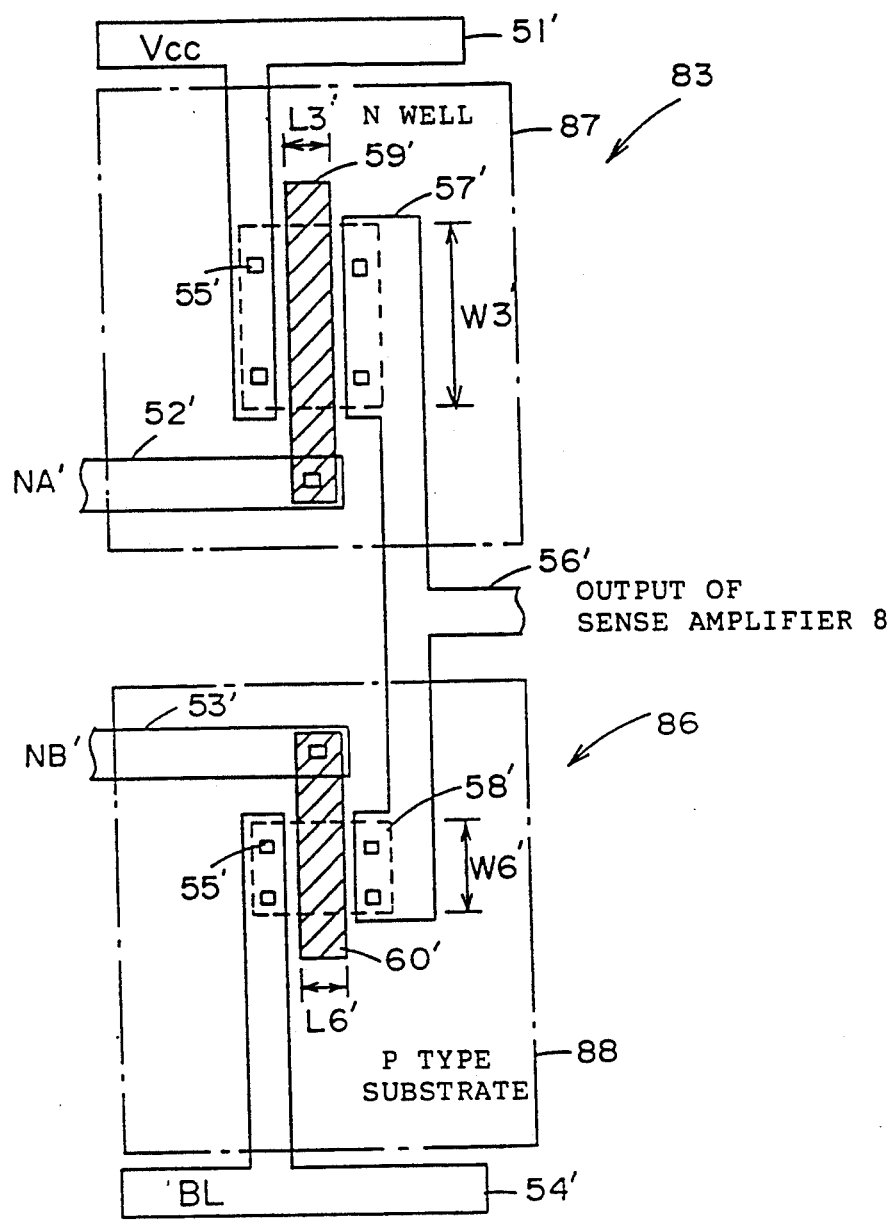
FIG. 6 shows a layout of transistors 83 and 86 on a semiconductor substrate.

In order to apply the characteristics shown in FIGS. 3 and 4, transistors 73, 76, 83 and 86 provided in sense amplifiers 7 and 8 are formed on the semiconductor substrate as shown in FIGS. 5 and 6.

Referring to FIG. 5, transistor 73 is formed in an N-well 77 formed in the P-type semiconductor substrate. Transistor 73 has a gate formed of a polysilicon interconnection 59. Transistor 73 has a source and a drain which are formed of a diffusion layer 57 formed in N-well 77. The source of transistor 73 is connected to an aluminum interconnection 51 through contact holes 55. The drain of transistor 73 is connected to an aluminum interconnection 56 through contact holes.

Transistor 76 is formed in a P-type semiconductor substrate 78. Transistor 76 has a gate formed of a polysilicon interconnection 60. Transistor 76 has a source and a drain which are formed of a diffusion layer 58 formed in P-type substrate 78. The source of transistor 76 is connected to an aluminum interconnection 54 through contact holes. The drain of transistor 76 is connected to aluminum interconnection 56 through contact holes.

A node NA on aluminum interconnection 52 corresponds to node NA shown in FIG. 2. Node NB on aluminum interconnection 53 corresponds to node NB shown in FIG. 2. Transistor 73 has a channel width W3 and a channel length L3. Transistor 76 has a channel width W6 and a channel length L6.

FIG. 6 shows a layout of transistors 83 and 86. The layout shown in FIG. 6 is similar to that shown in FIG. 5, and thus will not be described in detail. Transistor 83 has a channel width W3' and a channel length L3'. Transistor 86 has a channel width W6, and a channel length L6'. In order to apply the sensing characteristics shown in FIGS. 3 and 4 to sense amplifiers 7 and 8, it is necessary that mutual conductances gm3, gm6, gm3' and gm6' of transistors 73, 76, 83 and 86 satisfy at least one of the following relations.

$$gm3 < gm3' \quad (1)$$

$$gm6 > gm6' \quad (2)$$

In order to apply the mutual conductances expressed by inequality (1) or (2), the widths of gates of transistors 73, 76, 83 and 86 satisfy the following relations.

$$W3 < W3' \quad (3)$$

$$W6 > W6' \quad (4)$$

If at least one of the inequalities (3) and (4) is satisfied, the sensing characteristics shown in FIGS. 3 and 4 can be obtained.

In place of the relations expressed by the inequalities (3) and (4), the similar sensing characteristics may be obtained in a case that the following relations relating to the channel lengths are satisfied.

$$L3 > L3' \quad (5)$$

$$L6 < L6' \quad (6)$$

Figure 7:
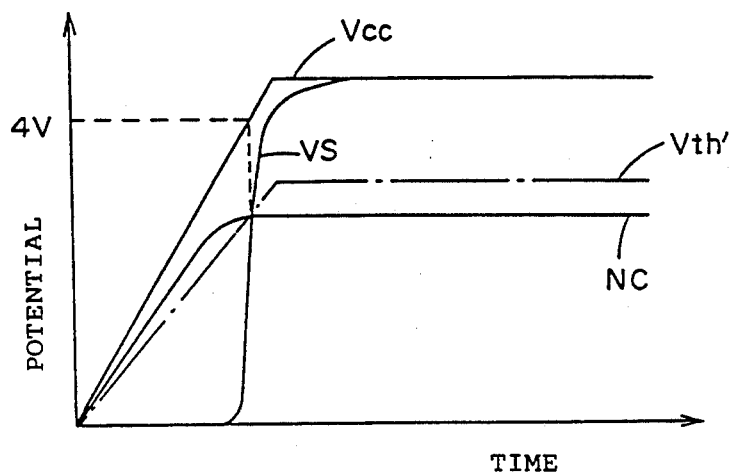
FIG. 7 is a potential transition diagram showing an operation of Vcc level detector 4 shown in FIG. 2.

FIG. 7 is a potential transition diagram showing an operation of Vcc level detector 4 shown in FIG. 2. Referring to FIG. 7, the abscissa represents an elapsed time, and the ordinate represents a potential. Line Vcc indicates the change of supply voltage Vcc. Line NC indicates the change of potential at the input node NC of inverter 44 shown in FIG. 2. Line Vth' indicates the change of the threshold voltage of the inverter 44. Line VS indicates the change of output signal VS. For example, when the supply voltage changes as indicated by line Vcc in FIG. 7, the threshold voltage of inverter 44 changes as indicated by line Vth'. Transistor 41 works as a resistor having a fixed resistance. Since each of transistors 42 and 43 works as a diode, the potential at the input node of inverter 44 changes as indicated by line NC. That is; the potential at node NC is proportional to supply voltage Vcc which is in a lower range (lower than 4 V), and is saturated in a higher range of supply voltage Vcc (higher than 4 V). Therefore, after supply voltage Vcc exceeds 4 V, the potential at node NC becomes lower than threshold voltage Vth' of inverter 44, so that inverter 44 generates signal VS at the high level.

Figure 8:
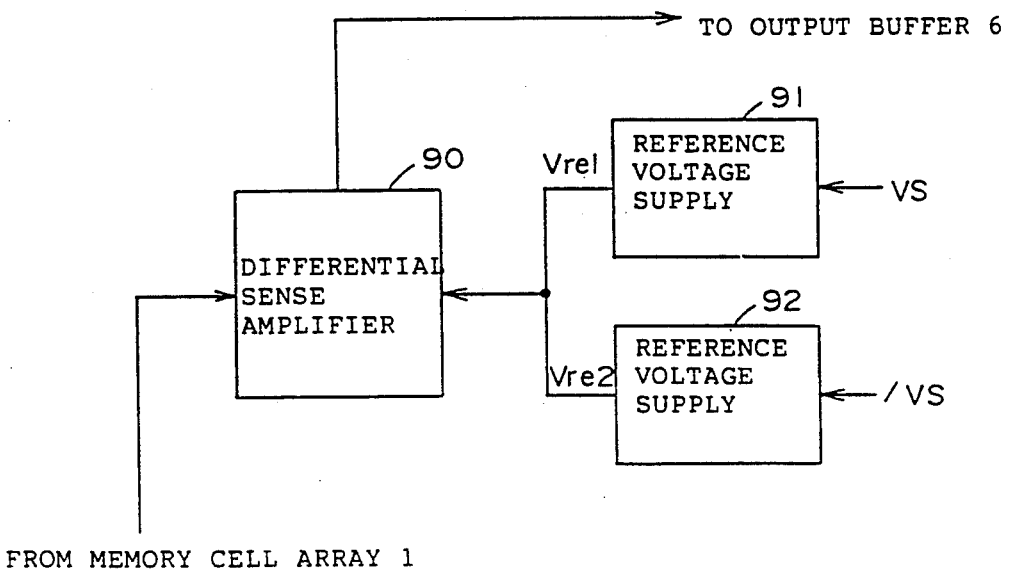
FIG. 8 is a block diagram of a read circuit in a flash EEPROM showing another embodiment of the invention.

FIG. 8 is a block diagram of a read circuit applicable to a flash EEPROM showing another embodiment of the invention. Referring to FIG. 8, this read circuit includes a differential sense amplifier 90 for amplifying the data signal supplied from the memory cell array, a reference voltage source 91 for generating a low reference voltage Vre1, and a reference voltage source 92 for generating a high reference voltage Vre2. Reference voltage source 91 supplies low reference voltage Vre1 in response to signal VS at the low level supplied from Vcc level detector 4. Reference voltage source 92 supplies high reference voltage Vre2 in response to signal /VS at the low level. Therefore, differential sense amplifier 90 receives low reference voltage Vre1 when supply voltage Vcc is in a predetermined low range (lower than 4 V). When supply voltage Vcc is in the predetermined higher range (higher than 4 V), differential sense amplifier 90 receives high reference voltage Vre2. Based on the applied reference voltage, differential sense amplifier 90 differentially amplifies the data signal supplied from the memory cell array. The amplified signal is applied to the output buffer.

Also in the embodiment shown in FIG. 8, even if supply voltage Vcc changes, the correct data reading operation is achieved, because the reference voltage applied to differential sense amplifier 90 is changed.

As described above, improved flash EEPROM 100 shown in FIG. 1 comprises sense amplifier 7 having the sensing characteristics suitable for sensing the data signal under the supply voltage Vcc in the predetermined lower range, and sense amplifier 8 having the sensing characteristics suitable for sensing the data signal under the supply voltage Vcc in the predetermined higher range. The range in which the supply voltage Vcc actually exists is detected by Vcc level detector 4. Therefore, even if supply voltage Vcc varies, sense amplifier 7 or 8 having the optimum sensing characteristics is selectively enabled, so that the error does not occur in the amplification of the data signal. In other words, even if the variable supply voltage Vcc is applied, the stored data can be correctly read.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operable under an externally applied variable supply voltage, comprising:

a memory cell array including a plurality of memory cells disposed in rows and columns;

first and second sense amplifiers, each including an input node and connected to receive a data signal provided from said memory cell array through the corresponding input node;

said first sense amplifier having sensing characteristics suitable for sensing said data signal in a predetermined lower range of said supply voltage;

said second sense amplifier having sensing characteristics suitable for sensing said data signal in a predetermined higher range of said supply voltage;

supply voltage level detecting means for detecting in which of said predetermined lower range and said predetermined higher range a level of said externally applied supply voltage exists; and selectively enabling means for selectively enabling one of said first and second sense amplifiers in response to said supply voltage level detecting means.

2. A semiconductor memory device according to claim 1, wherein said supply voltage level detecting means includes proportion-saturation voltage generating means for generating a proportion-saturation voltage which is proportional to said supply voltage in said predetermined lower range and is saturated in said predetermined higher range, and comparing means having a threshold voltage proportional to said supply voltage for comparing the proportion-saturated voltage generated by said proportion-saturation voltage generating means and said threshold voltage.

3. A semiconductor memory device according to claim 2, wherein
said proportion-saturation voltage generating means includes resistor means and diode means connected in series between said supply voltage and the ground, and said proportion-saturation voltage is supplied through a common connection node of said resistor means and said diode means.

4. A semiconductor memory device according to claim 2, wherein
said comparing means includes inverter means having said threshold voltage proportional to said supply voltage, and said inverter means is connected to receive the proportion-saturated voltage generated from said proportion-saturation voltage generating means.

5. A semiconductor memory device according to claim 1, wherein
said first sense amplifier includes first and second field effect transistors connected in series between said supply voltage and said input node of said first sense amplifier, said first and second field effect transistors having a common connection node which forms an output node of said first sense amplifier, and
said second sense amplifier includes third and fourth field effect transistors connected in series between said supply voltage and said input node of said second sense amplifier, said third and fourth field effect transistors having a common connection node which forms an output node of said second sense amplifier.

6. A semiconductor memory device according to claim 5, wherein
said first and third field effect transistors are operated in response to an output signal provided from said supply voltage level detecting means, and
said second and fourth field effect transistors are operated in response to a data signal provided from said memory cell array.

7. A semiconductor memory device according to claim 6, wherein
said first field effect transistor has a mutual conductance lower than that of said third field effect transistor.

8. A semiconductor memory device according to claim 7, wherein
said second field effect transistor has a mutual conductance higher than that of said fourth field effect transistor.

9. A semiconductor memory device according to claim 8, wherein
said first field effect transistor has a channel width narrower than that of said third field effect transistor, and
said second field effect transistor has a channel width wider than that of said fourth field effect transistor.

10. A semiconductor memory device according to claim 1, wherein
said semiconductor memory device is a nonvolatile semiconductor memory device.

11. A semiconductor memory device operable under an externally applied variable supply voltage, comprising:

a memory cell array including a plurality of memory cells disposed in rows and columns;
a differential sense amplifier including first and second input nodes and receiving a data signal provided from said memory cell array through said first input node;
first and second reference voltage sources which generate a low reference voltage and a high reference voltage, respectively;
supply voltage level detecting means for detecting in which of a predetermined lower range and a predetermined higher range a level of said externally applied supply voltage exists; and
selectively supplying means for selectively supplying one of said first and second reference voltages to said second input node of said differential sense amplifier in response to said supply voltage level detecting means.

12. A semiconductor memory device according to claim 1, wherein said semiconductor memory device is an electrical erasable/programmable read only memory (EEPROM).

13. A semiconductor memory device according to claim 1, wherein said semiconductor memory device is an electrical programmable read only memory (EPROM).

14. A semiconductor memory device according to claim 3, wherein said semiconductor memory device is an electrical erasable/programmable read only memory (EEPROM).

15. A semiconductor memory device according to claim 3, wherein said semiconductor memory device is an electrical programmable read only memory (EPROM).

16. A semiconductor memory device according to claim 4, wherein said semiconductor memory device is an electrical erasable/programmable read only memory (EEPROM).

17. A semiconductor memory device according to claim 4, wherein said semiconductor memory device is an electrical programmable read only memory (EPROM).

18. A semiconductor memory device according to claim 9, wherein said semiconductor memory device is an electrical erasable/programmable read only memory (EEPROM).

19. A semiconductor memory device according to claim 9, wherein said semiconductor memory device is an electrical programmable read only memory (EPROM).

20. A semiconductor memory device according to claim 10, wherein said nonvolatile semiconductor memory device is an electrical erasable/programmable read only memory (EEPROM).

21. A semiconductor memory device according to claim 10, wherein said nonvolatile semiconductor memory device is an electrical programmable read only memory (EPROM).

22. A semiconductor memory device according to claim 11, wherein said semiconductor memory device is an electrical erasable/programmable read only memory (EEPROM).

23. A semiconductor memory device according to claim 11, wherein said semiconductor memory device is an electrical programmable read only memory (EPROM).

* * * * *